United States Patent
Poulton et al.

(10) Patent No.: US 12,525,921 B2
(45) Date of Patent: Jan. 13, 2026

(54) AMPLIFIER SYSTEM

(71) Applicant: Qorvo US, Inc., Greensboro, NC (US)

(72) Inventors: Matthew Poulton, Concord, NC (US); Jeffrey Gengler, McKinney, TX (US); Donald F. Kimball, El Cajon, CA (US); Mark Briffa, Tyreso (SE); Nikolaus Klemmer, Dallas, TX (US); Gangadhar Burra, Fremont, CA (US)

(73) Assignee: Qorvo US, Inc., Greensboro, NC (US)

( * ) Notice: Subject to any disclaimer, the term of this patent is extended or adjusted under 35 U.S.C. 154(b) by 431 days.

(21) Appl. No.: 18/055,998

(22) Filed: Nov. 16, 2022

(65) Prior Publication Data

US 2023/0261614 A1   Aug. 17, 2023

Related U.S. Application Data (60) Provisional application No. 63/310,893, filed on Feb. 16, 2022.

(51) Int. Cl.
  *H03F 1/00*   (2006.01)
  *H03F 1/02*   (2006.01)
  *H03F 3/24*   (2006.01)

(52) U.S. Cl.
  CPC .......... *H03F 1/0205* (2013.01); *H03F 3/245* (2013.01)

(58) Field of Classification Search
  CPC .. H03F 1/0205; H03F 3/245; H03F 2200/451; H03F 3/195; H03F 1/0261; H03F 1/0288
  See application file for complete search history.

(56) References Cited

U.S. PATENT DOCUMENTS

| | | | |
|---|---|---|---|
| 7,457,617 B2 * | 11/2008 | Adams | H03F 3/19 |
| | | | 455/418 |
| 10,103,690 B2 | 10/2018 | Yanduru et al. | |

(Continued)

FOREIGN PATENT DOCUMENTS

| | | |
|---|---|---|
| EP | 2372905 A1 | 10/2011 |
| EP | 3089359 A1 | 11/2016 |
| WO | 2022197334 A1 | 9/2022 |

OTHER PUBLICATIONS

Disclosed Anonymously, "Doherty amplifer with cooperative power tracking and bias adaption for high efficiency," Research Disclosure, Database No. 578037, Jun. 2012, published online May 2012, 27 pages.

(Continued)

*Primary Examiner* — Md K Talukder
(74) *Attorney, Agent, or Firm* — Withrow & Terranova, P.L.L.C.

(57) ABSTRACT

A load-modulated amplifier system is disclosed having a main amplifier with drain or collector voltage bias input, and an auxiliary amplifier having a static drain or collector voltage bias input. Also disclosed is a programmable voltage bias controller having a data interface configured to receive operating traffic level data symbol data associated with a basestation. The programmable bias controller further includes a processor coupled to the data interface and configured, in response to the traffic or symbol data, to determine and apply bias levels to the carrier drain or collector bias input and the auxiliary drain or collector bias input and to provide an amplifier efficiency theoretically between 60% and 78.5% over the low traffic operation zone −9 dB to −15 dB backed off from amplifier peak power.

22 Claims, 5 Drawing Sheets

(56) References Cited

U.S. PATENT DOCUMENTS

| | | | |
|---|---|---|---|
| 10,804,866 B2 | 10/2020 | Lehtola | |
| 11,101,775 B2* | 8/2021 | Datta | H03F 1/0288 |
| 2007/0139105 A1* | 6/2007 | Kennan | H03F 3/72 |
| | | | 330/124 R |
| 2009/0140887 A1* | 6/2009 | Breed | G01C 21/1656 |
| | | | 701/116 |
| 2013/0163647 A1* | 6/2013 | Hagisawa | H03F 1/30 |
| | | | 375/219 |
| 2016/0072447 A1* | 3/2016 | Seth | H03F 3/193 |
| | | | 330/259 |
| 2016/0153961 A1* | 6/2016 | Kuramochi | C12Q 1/6869 |
| | | | 204/403.01 |
| 2016/0315586 A1* | 10/2016 | Itagaki | H03F 3/211 |
| 2017/0063316 A1* | 3/2017 | Akbarpour | H03F 3/3028 |
| 2017/0163217 A1* | 6/2017 | Bonebright | H03F 3/68 |
| 2019/0058448 A1* | 2/2019 | Seebacher | H04B 1/401 |
| 2019/0089070 A1* | 3/2019 | Zihir | H01Q 21/205 |
| 2019/0158047 A1* | 5/2019 | Watkins | H03F 3/72 |
| 2019/0379335 A1 | 12/2019 | Scott et al. | |
| 2020/0014338 A1* | 1/2020 | Datta | H03F 3/245 |
| 2020/0028472 A1 | 1/2020 | Scott et al. | |
| 2020/0112287 A1 | 4/2020 | Pham et al. | |
| 2021/0257974 A1* | 8/2021 | Wu | H03F 3/604 |
| 2022/0239261 A1* | 7/2022 | Ishihara | H03F 1/302 |
| 2023/0198469 A1* | 6/2023 | Ladhani | H03F 3/245 |
| | | | 455/114.3 |
| 2023/0261614 A1* | 8/2023 | Poulton | H03F 1/0205 |
| | | | 455/39 |

OTHER PUBLICATIONS

Gustafsson, D. et al., "A Novel Wideband and Reconfigurable High Average Efficiency Power Amplifier," 2012 IEEE/MTT-S International Microwave Symposium Digest, Jun. 17-22, 2012, Montreal, QC, Canada, IEEE, 3 pages.

Mohamed, A.M.M. et al., "Reconfigurable Doherty Amplifier for Efficient Amplification of Signals with Variable PAPR," 2013 IEEE MTT-S International Microwave Symposium Digest (MTT), Jun. 2-7, 2013, Seattle, WA, USA, IEEE, 3 pages.

International Search Report and Written Opinion for International Patent Application No. PCT/US2021/057801, mailed Feb. 3, 2022, 18 pages.

Written Opinion for International Patent Application No. PCT/US2021/057801, mailed Feb. 14, 2023, 6 pages.

International Preliminary Report on Patentability for International Patent Application No. PCT/US2021/057801, mailed Jun. 12, 2023, 17 pages.

* cited by examiner

FIG. 6

AMPLIFIER SYSTEM

RELATED APPLICATIONS

This application claims the benefit of provisional patent application Ser. No. 63/310,893, filed Feb. 16, 2022, the disclosure of which is hereby incorporated herein by reference in its entirety.

FIELD OF THE DISCLOSURE

The present disclosure relates to radio frequency power amplifiers that are responsive to dynamic peak-to-average power ratios and in particular to improving efficiency in load-modulated power amplifiers, such as Doherty-type amplifiers.

BACKGROUND

Figure 1:
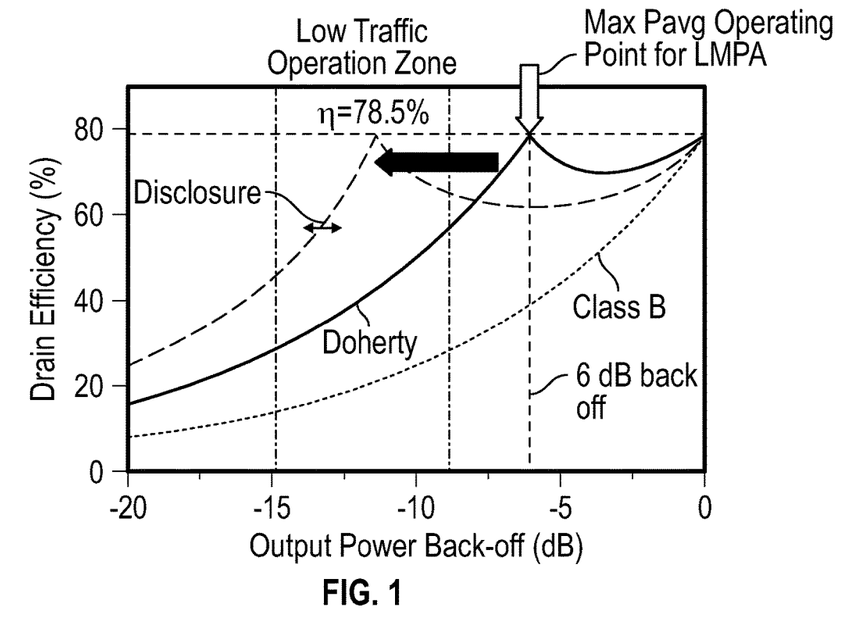
FIG. 1 is a diagram showing a typical power back-off efficiency curve from maximum operating power for a load modulated (Doherty) power amplifier, which is a Class B power amplifier, and the improvement in the low traffic operational zone in accordance with the present disclosure.

Load-modulated power amplifiers (LMPAs) as currently designed are intended to provide a high lineup efficiency in the face of modern modulation techniques that generate high peak-to-average power ratio signals. Traditionally, a designer of a LMPA, such as a Doherty amplifier, starts designing the Doherty amplifier with a specific peak-to-average power ratio (PAPR) in mind. Then the designer adjusts an amount of amplifier asymmetry between a carrier amplifier and an auxiliary amplifier that make up the Doherty amplifier in order to place a Doherty efficiency "tent" in the vicinity of the maximum average output power that is envisioned for the present disclosure. FIG. 1 has a large black arrow showing one efficiency tent moved from a maximum average power operating point for an LMPA to another low traffic operation zone.

Other design factors such as components using radio frequency impedance matching networks fabricated on a printed circuit board on which an LMPA resides can be adjusted to ensure that the design provides the maximum average power efficiency at an operating point indicated by a large white arrow in FIG. 1. However, these design parameters are static and fixed at the time of the design. Once the design is finished and manufactured, the parameters cannot be adjusted.

However, in actual deployments of Doherty amplifiers in a basestation such as an Evolved Node B (eNodeB) of a communications network, it is typical that the traffic loading from User Equipment such as smart phones will vary based on several operational factors such as the type of data being transmitted and received, geographic location and obstacles, and the number of users on the given cell site. The area bounded by dot-dashed lines shown in FIG. 1 shows an area of operating range, below the maximum operating point which will occur during normal operation, and shows that the efficiency of the LMPA is well below the maximum of the LMPA, which results in sub-optimal performance. As such, there is a need for LMPA system that is responsive to dynamic changes in traffic loading of the cell.

SUMMARY

A radio frequency (RF) amplifier system is disclosed having a main amplifier comprising a driver and final stages with drain or collector voltage bias input, and an auxiliary amplifier comprising a driver and final stages having a drain or collector bias input. Also included is a programmable bias controller for the main amplifier having a data interface configured to receive traffic-level operating data or symbol rate level data associated with a basestation. The programmable bias controller further includes a processor coupled to the data interface and configured to determine and apply bias levels to the main amplifier bias input, to maximize the RF power amplifier (RFPA) efficiency at back-off levels −9 dB to −15 dB below the peak power of the RFPA (no loss, theoretically 60% to 78.5%). This improves RFPA efficiency in this operating zone to levels well above the statically biased RFPA (no loss, theoretically 27% to 55% range).

The system according to the present disclosure allows for dynamic adjustment of the RFPA to the main amplifier, significantly improving operational efficiency over a wide range of traffic loading.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to a radio frequency power amplifier system that generates software-controllable bias voltages for a main amplifier drain bias for a load-modulated power amplifier (LMPA). The provided freedom to adjust these parameters under software control allows the LMPA to adapt to various traffic-loading operational modes typical in 5G cellular network operation, raising the power efficiency of a communications network and reducing the operational costs and power consumption of the network significantly. An advantage of embodiments according to the present disclosure is that the embodiments allow for higher transmitter efficiency under dynamic traffic loading variations.

FIG. 1 is a diagram showing a typical power efficiency tent for a Doherty amplifier. Advantages provided by embodiments of the present disclosure include near continual maximization of power efficiency under processor control and added flexibility in setting most appropriate bias levels for various traffic loading for radio frequency signals to be amplified by the load modulated amplifier.

FIG. 1 shows a typical power back-off efficiency curve from maximum operating power for load-modulated (Doherty), Class B power amplifier and an example of the efficiency curve attainable in accordance with the present disclosure. The graph highlights the low traffic operational zone common for cellular applications. The dashed efficiency curve can be set anywhere within the typical low traffic operational region in accordance with the present disclosure. By contrast, the white arrow shows the static biased LMPA peak efficiency point, and its associated efficiency curve drops rapidly in the low traffic zone between the dot-dash lines. The class B amplifier behaves with even lower efficiency in the low traffic zone. The system according to the present disclosure allows the LMPA to move the peak efficiency point to any desired point within the low traffic zone (marked "Disclosure" and shown with a dashed efficiency curve) and back again, to the maximum peak average power dynamically, with no need for additional circuit adjustment. Additional adjustments such as dynamic radio frequency (RF) matching adjustment or component, for example, dynamic capacitor tuning, are difficult to implement and require more space and additional circuit complexity, which can compromise efficiency performance due to additional losses or cross-talk. The disclosed amplifier system avoids the need for this additional RF circuitry complexity.

Figure 2:
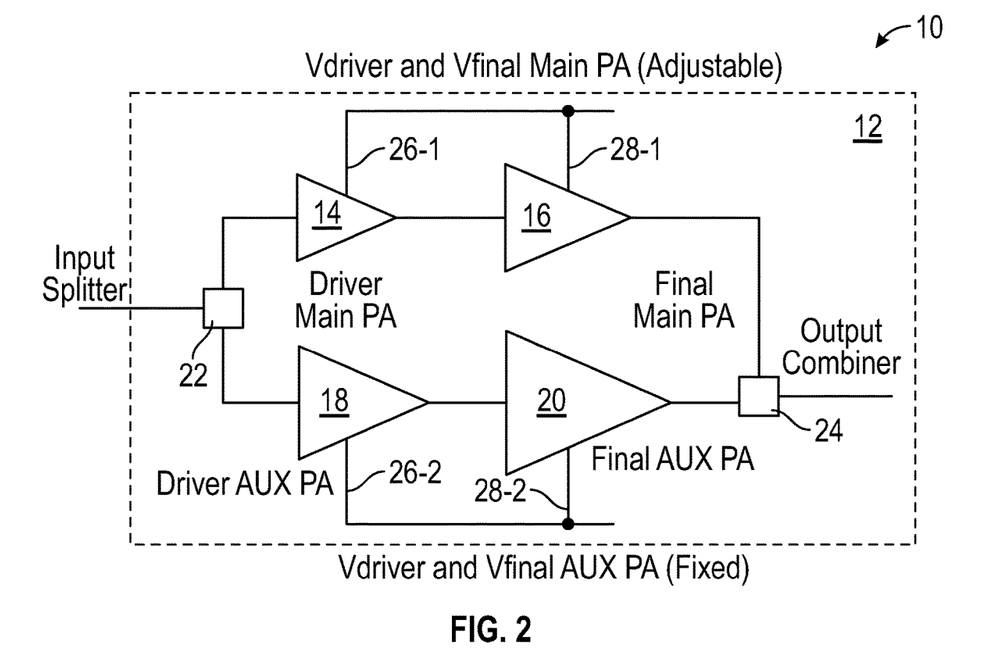
FIG. 2 is a high-level diagram of a first exemplary embodiment according to the present disclosure in which the main amplifier drain or collector voltage can be adjusted together.
Figure 3:
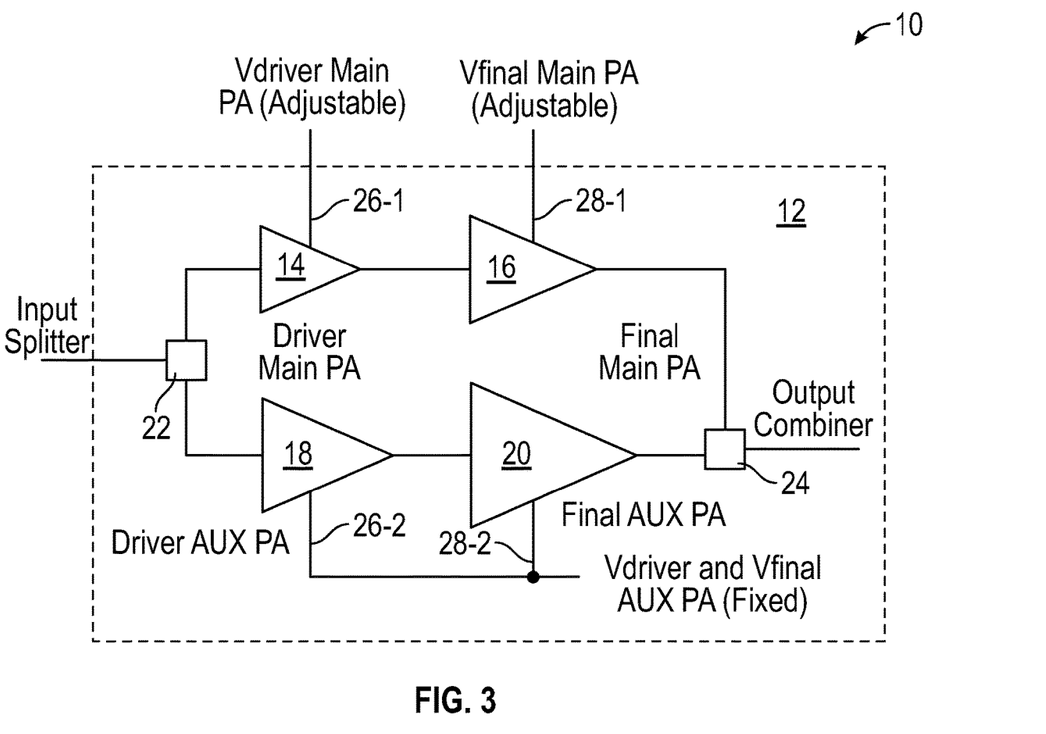
FIG. 3 is a high-level diagram of a second embodiment in which the main amplifier drain or collector voltage may be adjusted independently.

In this regard, FIGS. 2 and 3 are high-level diagrams of a first exemplary embodiment and a second exemplary embodiment of an amplifier system 10 according to the present disclosure. Each of the first and second embodiments combine a main amplifier path and an auxiliary amplifier path in a LMPA 12. A main driver amplifier 14 and a final main amplifier 16 are coupled in series to make up the main amplifier path of the LMPA 12. An auxiliary driver amplifier 18 and an auxiliary final amplifier 20 are coupled in series to make up the auxiliary amplifier path, which is in parallel with the main amplifier path. A signal input splitter 22 is configured to split an input signal and send a first portion of the input signal to the main amplifier path and a second portion of the input signal to the auxiliary amplifier path. The input splitter 22 may be any number of RF circuits designed to provide matched signal splitting, for example, a Wilkinson splitter. For a Doherty amplifier-type version of the exemplary embodiments, the auxiliary path only contributes to the signal power for higher output powers, maintaining higher efficiency over a wider dynamic range of output powers than a class B amplifier. An output combiner 24 is configured to sum amplified portions of signal input contributed by the main amplifier path and the auxiliary final amplifier. The output combiner 24 may be an impedance inverter, a 90-degree hybrid combiner, or other RF combining network. Embodiments of the disclosed LMPA 12 are configured to provide high peak-to-average power ratio (PAPR) modulations, such as those used in 4G and 5G cellular networks to maximize backed off power efficiency at the peak average power operating point. Generally, the amplifier system 10 is configured so that biases of the main driver amplifier 14 and the final main amplifier 16 is adjustable. This increases the dynamic power range over which maximum efficiency can be achieved into very lower power ranges, as shown in the graph of FIG. 1.

As depicted in FIG. 2, the first embodiment of the amplifier system offers combined voltage bias adjustment with a main driver bias input 26-1 of the main driver amplifier 14 and a final main bias input 28-1 of the final main amplifier 16 coupled together. As depicted in FIG. 3, the second embodiment of the amplifier system 10 is configured with the main driver bias input 26-1 and the final main bias input 28-1 being uncoupled to allow the bias of the main driver amplifier 14 and the bias of the final main amplifier 16 to be adjusted independently. The first embodiment of the amplifier system 10 depicted in FIG. 2 and the second embodiment of the amplifier system 10 depicted in FIG. 3 are both configured to operate with fixed biases for the auxiliary driver amplifier 18 and the final auxiliary amplifier 20. As such, in this exemplary embodiment an auxiliary driver bias input 26-2 of the auxiliary driver amplifier 18 and a final auxiliary bias input 28-2 of the final auxiliary amplifier 20 are coupled together.

Figure 4:
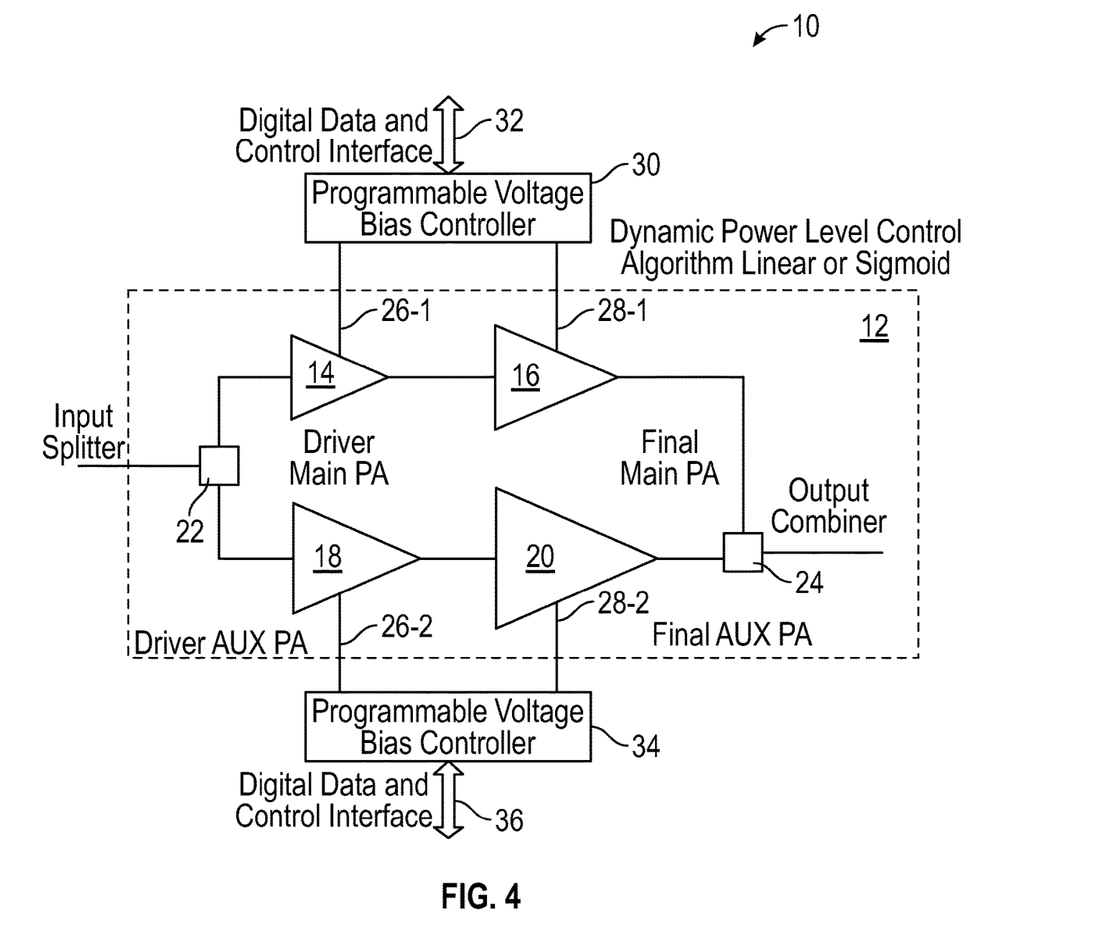
FIG. 4 is a high-level diagram of an implementation of a third exemplary embodiment according to the present disclosure in which the voltage adjustment is performed by a programmable voltage bias controller.

FIG. 4 is a diagram of a third embodiment of the amplifier system 10, which in according to the present disclosure is configured to provide an implementation flexibility ranging between realizing the relatively simple embodiments of FIG. 2 and FIG. 3 and a more generalized version that provides maximum dynamic efficiency adjustment. In this third embodiment, a main programmable voltage bias controller 30 is coupled to the main driver bias input 26-1 the final main bias input 28-1. The main programmable voltage bias controller 30 is configured to autonomously adjust bias levels of the main driver amplifier 14 and the final main amplifier 16 and thereby enhance efficiency of the LMPA 12. The bias adjustments generated by the main programmable voltage bias controller 30 may follow a linear, sigmoid, or arbitrary function. A main bias data bus 32 is configured to provide an adjustment prompt command for timing adjustment and may be generated by an external controller (not shown).

An auxiliary programmable voltage bias controller 34 is coupled to the auxiliary driver bias input 26-2 of the auxiliary driver amplifier 18 and the final auxiliary bias input 28-2 of the final auxiliary amplifier 20. The auxiliary programmable voltage bias controller 34 is configured to autonomously adjust bias levels of the auxiliary driver amplifier 18 and the final auxiliary amplifier 20 and thereby further enhance efficiency of the LMPA 12. The bias adjustments generated by the auxiliary programmable voltage bias controller 34 may follow a linear, a sigmoid, or an arbitrary function. An auxiliary bias data bus 36 is configured to transfer an adjustment prompt command for timing adjustment that may be generated by the external controller (not shown). The third exemplary embodiment provides for minimal losses and bias adjustment to establish an efficiency point based on slow-occurring operational conditions, such as time of day or public event versus normal loading.

Figure 5:
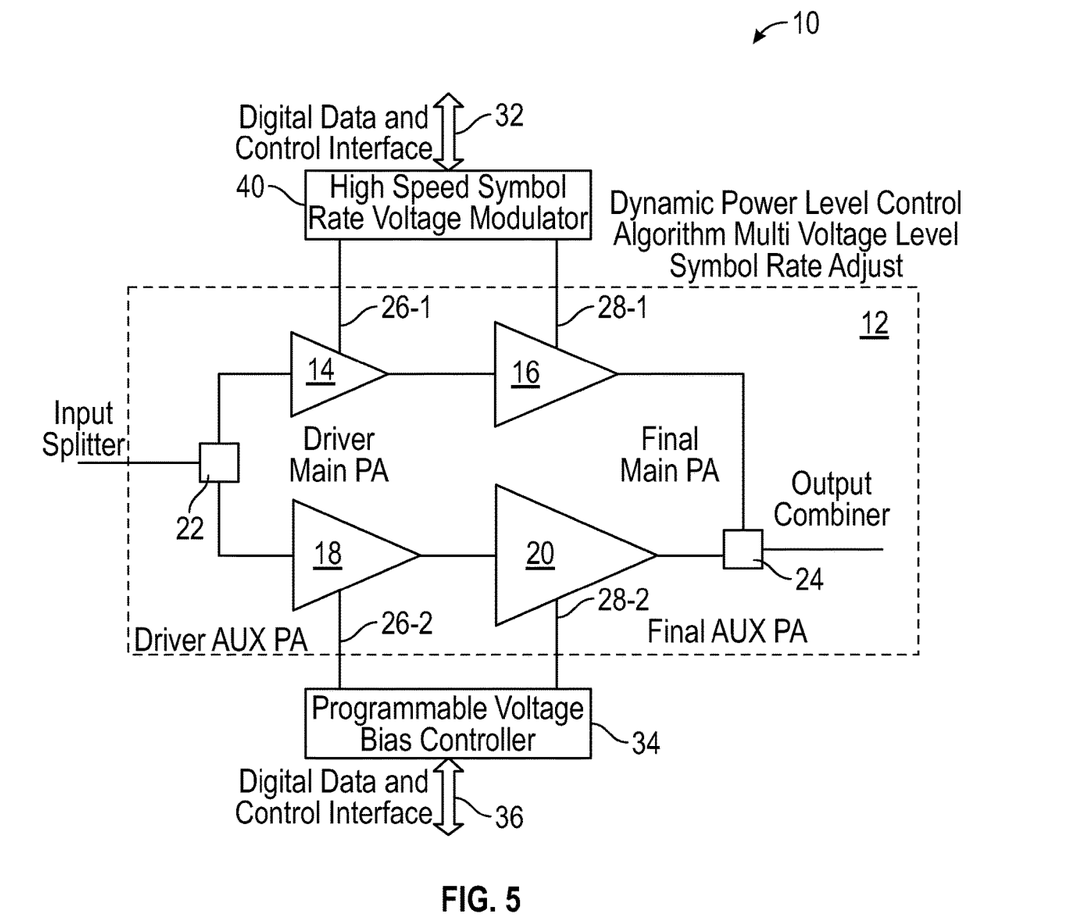
FIG. 5 is a high-level diagram of an implementation of a third exemplary embodiment according to the present disclosure in which the voltage adjustment is performed at symbol data rates by a high-speed voltage modulator configured to autonomously adjust the power amplifier bias and efficiency.

FIG. 5 is a high-level diagram of a fourth exemplary embodiment according to the present disclosure in which voltage adjustment is performed at symbol data rates by a high-speed voltage modulator 40 that is configured to autonomously adjust the biases of the main driver amplifier 14 and the final main amplifier 16 bias and thereby improve efficiency. The main amplifier data bus 32 provides transfer of a bias adjustment prompt command based on symbol power level change of the traffic modulation. The bias adjustment prompt command is generated by an external processor (not shown). This fourth exemplary embodiment provides dynamic efficiency adjustment on a constant basis to ensure maximum efficiency is provided in all traffic scenarios, including type of user data being transmitted, instantaneous user count changes, and fast-moving and slow-moving user efficiency adaptation.

Figure 6:
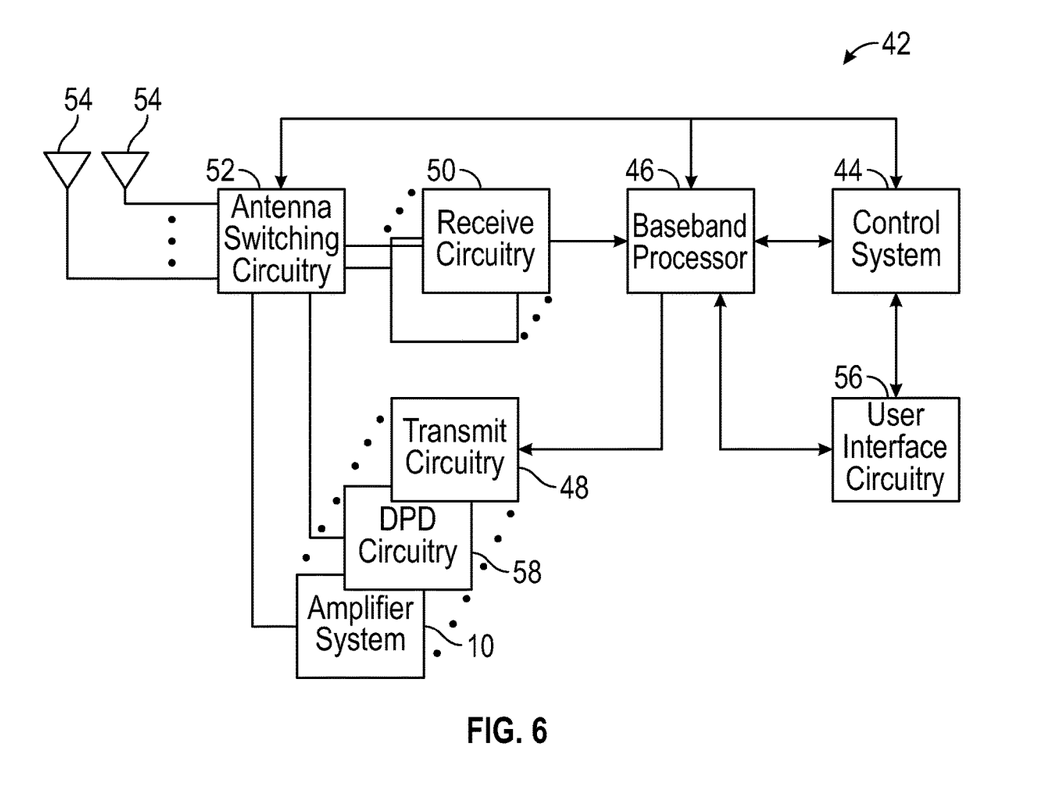
FIG. 6 shows how the disclosed amplifier system interacts with user elements such as wireless communication devices.

With reference to FIG. 6, the concepts described above may be implemented in various types of wireless communication devices or user elements 42, such as mobile terminals, smart watches, tablets, computers, navigation devices, access points, and the like that support wireless communications, such as cellular, wireless local area network (WLAN), Bluetooth, and near field communications. The user elements 42 will generally include a control system 44, a baseband processor 46, transmit circuitry 48, receive circuitry 50, antenna switching circuitry 52, multiple antennas 54, and user interface circuitry 56. The receive circuitry 50 receives radio frequency signals via the antennas 54 and through the antenna switching circuitry 52 from one or more basestations. A low-noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams.

The baseband processor 46 processes the digitized received signal to extract the information or data bits conveyed in the received signal. This processing typically comprises demodulation, decoding, and error correction operations. The baseband processor 46 is generally implemented in one or more digital signal processors (DSPs) and application-specific integrated circuits (ASICs). For transmission, the baseband processor 46 receives digitized data, which may represent voice, data, or control information, from the control system 44, which it encodes for transmission. The encoded data is output to the transmit circuitry 48, where it is used by a modulator to modulate a carrier signal that is at a desired transmit frequency or frequencies. The amplifier system 10 will amplify the modulated carrier signal to a level appropriate for transmission and deliver the modulated carrier signal to the antennas 54 through the antenna switching circuitry 52. The multiple antennas 54 and the replicated transmit and receive circuitries 48, 50 may provide spatial diversity. Not key to the amplifier system 10 according to the present disclosure, but typical of 5G cellular radio systems, the output from the LMPA 12 is fed back to Digital Predistortion (DPD) correction functions provided by DPD circuitry 58 in the transmitter circuitry 48 for linearity correction. The amplifier system 10 according to the present disclosure requires that the DPD circuitry can adjust the linearity correction based on the current maximized efficiency conditions set by the amplifier system 10 according to the present disclosure. The linearity correction may be completed relatively quickly within a standard adjustment cycle. Other modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An amplifier system comprising:
    a load modulation power amplifier (LMPA) comprising:
        a final main amplifier;
        an auxiliary final amplifier;
        a signal input splitter coupled between signal inputs of the final main amplifier and the auxiliary final amplifier;
        an output combiner coupled between signal outputs of the final main amplifier and the auxiliary final amplifier;
        a main bias controller coupled to a final main bias input of the final main amplifier wherein the main bias controller is configured as a high-speed voltage modulator to perform voltage adjustment at symbol data rates to autonomously adjust bias level of the final main amplifier and thereby maximize the efficiency of the LMPA; and
        an auxiliary bias controller coupled to an auxiliary final bias input of the auxiliary final amplifier, wherein the auxiliary bias controller is configured to autonomously adjust bias level of the auxiliary final amplifier and thereby aid in maximizing the efficiency of the LMPA.

2. The amplifier system of claim 1 further comprising a main driver amplifier coupled between the input of the final main amplifier and the signal input splitter, wherein a main driver bias input of the main driver amplifier is coupled to the main bias controller and the main bias controller is further configured to perform voltage adjustment at symbol data rates to autonomously adjust bias level of the main driver amplifier and thereby aid in maximizing the efficiency of the LMPA.

3. The amplifier system of claim 2 wherein main driver bias input and the final main bias input are configured to allow the biases of the main driver amplifier and the final main amplifier to be adjusted together.

4. The amplifier system of claim 3 wherein main driver bias input and the final main bias input are coupled together.

5. The amplifier system of claim 2 wherein main driver bias input and the final main bias input are configured to allow the biases of the main driver amplifier and the final main amplifier to be adjusted independently.

6. The amplifier system of claim 1 further comprising an auxiliary driver amplifier coupled between the input of the auxiliary final amplifier and the signal input splitter, wherein an auxiliary driver bias input of the auxiliary driver amplifier is coupled to the auxiliary bias controller and the auxiliary bias controller is further configured to autonomously adjust bias level of the auxiliary driver amplifier and thereby aid in maximizing the efficiency of the LMPA.

7. The LMPA of claim 1, wherein the main bias controller is a programmable voltage bias controller that is configured to use a linear function to adjust bias levels.

8. The LMPA of claim 1, wherein the main bias controller is a programmable voltage bias controller that is configured to use a sigmoid function to adjust bias levels.

9. The LMPA of claim 1, wherein the main bias controller is a programmable voltage bias controller that is configured to use an arbitrary function to adjust bias levels.

10. The LMPA of claim 1 further comprising a main control bus configured to convey an adjustment prompt command to the main bias controller for providing a timing adjustment to the main bias controller.

11. A method of operating an amplifier system having a final main amplifier, an auxiliary final amplifier, a signal input splitter coupled between signal inputs of the final main amplifier and the auxiliary final amplifier, an output combiner coupled between signal outputs of the final main amplifier and the auxiliary final amplifier, and a main bias controller coupled to a final main bias input of the final main amplifier, the method comprising:
    configuring the main bias controller as a high-speed voltage modulator; and
    autonomously adjusting bias level of the final main amplifier at symbol data rates by way of the main bias controller to maximize the efficiency of the LMPA.

12. The method of operating the amplifier system of claim 11 wherein a main driver amplifier is coupled between the input of the final main amplifier and the signal input splitter, wherein a main driver bias input of the main driver amplifier is coupled to the main bias controller, the method further comprising
    autonomously adjusting bias level of the main driver amplifier at symbol data rates by way of the main bias controller and thereby aid in maximizing the efficiency of the LMPA.

13. The method of operating the amplifier system of claim 11 wherein the amplifier system also has an auxiliary driver amplifier coupled between the input of the auxiliary final amplifier and the signal input splitter, wherein an auxiliary driver bias input of the auxiliary driver amplifier is coupled to the auxiliary bias controller, the method further comprising
    autonomously adjusting bias level of the auxiliary driver amplifier by way of the auxiliary bias controller and thereby aid in maximizing the efficiency of the LMPA.

14. The method of operating the amplifier system of claim 13 further comprising using a linear function to adjust bias levels by way of the main bias controller.

15. The method of operating the amplifier system of claim 13 further comprising using a sigmoid function to adjust bias levels by way of the main bias controller.

16. The method of operating the amplifier system of claim 13 further comprising using an arbitrary function to adjust bias levels by way of the main bias controller.

17. A wireless communication device comprising:
    a baseband processor;
    transmit circuitry configured to receive encoded data from the baseband processor and modulate a carrier signal with the encoded data, wherein the transmit circuitry comprises:

a load modulation power amplifier (LMPA) comprising:
  a final main amplifier;
  an auxiliary final amplifier;
  a signal input splitter coupled between signal inputs of the final amplifier and the auxiliary final amplifier;
  an output combiner coupled between signal outputs of the final amplifier and the auxiliary final amplifier;
  a main bias controller coupled to a final main bias input of the final main amplifier wherein the main bias controller is configured as a high-speed voltage modulator to perform voltage adjustment at symbol data rates to autonomously adjust bias level of the final main amplifier and thereby maximize the efficiency of the LMPA;
  an auxiliary bias controller coupled to an auxiliary final bias input of the auxiliary final amplifier, wherein the auxiliary bias controller is configured to autonomously adjust bias level of the auxiliary final amplifier and thereby aid in maximizing the efficiency of the LMPA.

18. The wireless communication device of claim 17 wherein the amplifier system further comprises a main driver amplifier coupled between the input of the final main amplifier and the signal input splitter, wherein a main driver bias input of the main driver amplifier is coupled to the main bias controller and the main bias controller is further configured to perform voltage adjustment at symbol data rates to autonomously adjust bias level of the main driver amplifier and thereby aid in maximizing the efficiency of the LMPA.

19. The wireless communication device of claim 18 wherein main driver bias input and the final main bias input are configured to allow the biases of the main driver amplifier and the final main amplifier to be adjusted together.

20. The wireless communication device of claim 19 wherein main driver bias input and the final main bias input are coupled together.

21. The wireless communication device of claim 19 wherein main driver bias input and the final main bias input are configured to allow the biases of the main driver amplifier and the final main amplifier to be adjusted independently.

22. The wireless communication device of claim 17 wherein the amplifier system further comprises an auxiliary driver amplifier coupled between the input of the auxiliary final amplifier and the signal input splitter, wherein an auxiliary driver bias input of the auxiliary driver amplifier is coupled to the auxiliary bias controller and the auxiliary bias controller is further configured to autonomously adjust bias level of the auxiliary driver amplifier and thereby aid in maximizing the efficiency of the LMPA.

* * * * *